United States Patent
Kim et al.

(10) Patent No.: US 7,541,288 B2
(45) Date of Patent: Jun. 2, 2009

(54) METHODS OF FORMING INTEGRATED CIRCUIT STRUCTURES USING INSULATOR DEPOSITION AND INSULATOR GAP FILLING TECHNIQUES

(75) Inventors: Jun-jung Kim, Fishkill, NY (US); Ja-hum Ku, LaGrangeville, NY (US); Jae-eon Park, Fishkill, NY (US); Sunfei Fang, LaGrangeville, NY (US); Alois Gutmann, Poughkeepsie, NY (US); O-sung Kwon, Wappingers Falls, NY (US); Johnny Widodo, Beacon, NY (US); Dae-won Yang, Hopewell Junction, NY (US)

(73) Assignees: Samsung Electronics Co., Ltd. (KR); International Business Machines Corporation, Armonk, NY (US); Infineon Technologies AG (DE); Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 11/683,590

(22) Filed: Mar. 8, 2007

(65) Prior Publication Data

US 2008/0220584 A1 Sep. 11, 2008

(51) Int. Cl.
*H01L 21/311* (2006.01)
(52) U.S. Cl. .................. 438/695; 438/694; 438/696; 438/700; 438/E21.029
(58) Field of Classification Search ......... 438/694–698, 438/700–701; 216/17–19, 74–79
See application file for complete search history.

(56) References Cited

U.S. PATENT DOCUMENTS

| | | | |
|---|---|---|---|
| 4,872,947 | A | 10/1989 | Wang et al. |
| 5,000,113 | A | 3/1991 | Wang et al. |
| 5,244,841 | A | 9/1993 | Marks et al. |
| 6,100,205 | A | 8/2000 | Liu et al. |
| 6,217,721 | B1 | 4/2001 | Xu et al. |
| 6,218,284 | B1 | 4/2001 | Liu et al. |
| 6,261,891 | B1 | 7/2001 | Cheng et al. |
| 6,335,249 | B1 | 1/2002 | Thei et al. |
| 6,455,891 | B2 | 9/2002 | Shimomura et al. |
| 6,541,370 | B1 | 4/2003 | Wang et al. |
| 6,664,639 | B2 | 12/2003 | Cleeves |
| 6,787,444 | B2 | 9/2004 | Gardner |

(Continued)

FOREIGN PATENT DOCUMENTS

JP 08-046173 2/1996

(Continued)

*Primary Examiner*—Dung A. Le
(74) *Attorney, Agent, or Firm*—Myers Bigel Sibley & Sajovec

(57) ABSTRACT

Methods of forming integrated circuit devices include depositing an electrically insulating layer onto an integrated circuit substrate having integrated circuit structures thereon. This deposition step results in the formation of an electrically insulating layer having an undulating surface profile, which includes at least one peak and at least one valley adjacent to the at least one peak. A non-uniform thickening step is then performed. This non-uniform thickening step includes thickening a portion of the electrically insulating layer by redepositing portions of the electrically insulating layer from the least one peak to the at least one valley. This redeposition occurs using a sputter deposition technique that utilizes the electrically insulating layer as a sputter target.

23 Claims, 3 Drawing Sheets

U.S. PATENT DOCUMENTS

| | | |
|---|---|---|
| 6,858,533 B2 | 2/2005 | Chu et al. |
| 7,002,209 B2 | 2/2006 | Chen et al. |
| 7,022,561 B2 | 4/2006 | Huang et al. |
| 7,078,346 B2 | 7/2006 | Liu et al. |
| 2003/0040158 A1 | 2/2003 | Saitoh |
| 2004/0175955 A1* | 9/2004 | Haselden et al. ............ 438/757 |
| 2005/0269650 A1 | 12/2005 | Pidin |
| 2006/0024879 A1 | 2/2006 | Fu et al. |

FOREIGN PATENT DOCUMENTS

| | | |
|---|---|---|
| JP | 08-250449 | 9/1996 |
| JP | 09-275140 | 10/1997 |
| JP | 10-041387 | 2/1998 |
| JP | 2001-298022 | 10/2001 |
| JP | 2003-060076 | 2/2003 |
| JP | 2003-060201 | 2/2003 |
| JP | 2004-104098 | 4/2004 |
| JP | 2005-353675 | 12/2005 |
| KR | 1020000003178 A | 1/2000 |
| KR | 1020010098548 A | 11/2001 |
| KR | 1020040023297 A | 3/2004 |
| KR | 1020050039234 A | 4/2005 |
| KR | 1020050048125 A | 5/2005 |
| KR | 1020050052581 A | 6/2005 |
| KR | 1020050068586 A | 7/2005 |

* cited by examiner

US 7,541,288 B2

METHODS OF FORMING INTEGRATED CIRCUIT STRUCTURES USING INSULATOR DEPOSITION AND INSULATOR GAP FILLING TECHNIQUES

FIELD OF THE INVENTION

The present invention relates to integrated circuit fabrication methods and, more particularly, to methods of fabricating field effect transistors in integrated circuit substrates.

BACKGROUND OF THE INVENTION

Conventional techniques to increase the levels of device integration on integrated circuit substrates can often lead to reductions in device yield and device reliability. Some of these reductions in device yield may be caused by the formation of voids or gaps within electrically insulating layers and also within electrical interconnects that may extend through one or more electrically insulating layers. In particular, the conformal deposition of relatively thick electrically insulating layers on closely-spaced integrated circuit structures having relatively narrow aspect ratios may lead to the formation of voids in the spaces between the integrated circuit structures. These voids can result in the formation of electrical shorts between electrical interconnects and other integrated circuit structures formed on the substrate. One attempt to address this problem includes the use of thinner insulating layers, however, the use of thinner insulating layers may lead to increases in parasitic capacitive coupling between adjacent integrated circuit structures, which can lower device operating speeds. Etch-back and other planarization techniques have also been developed to make the surface profiles of deposited insulating layers more uniform and limit the range of peaks and valleys in the surface profile. Unfortunately, such planarization techniques may not be effective when the layers to be planarized are located very close to a primary surface of an integrated circuit substrate.

SUMMARY OF THE INVENTION

Embodiments of the present invention include methods of forming integrated circuit structures and devices using insulator deposition and insulator gap filling techniques, to thereby define insulating layers having more uniform surface profiles. According to some of these embodiments, methods to form integrated circuit devices include depositing an electrically insulating layer onto an integrated circuit substrate having integrated circuit structures thereon. This deposition step results in the formation of an electrically insulating layer having an undulating surface profile, which includes at least one peak and at least on valley adjacent to the at least one peak. A non-uniform thickening step is then performed. This non-uniform thickening step includes thickening a portion of the electrically insulating layer by redepositing portions of the electrically insulating layer from the least one peak to the at least one valley. This redeposition occurs using a sputter deposition technique that utilizes the electrically insulating layer as a sputter target.

According to some of these embodiments, the depositing step includes depositing the electrically insulating layer onto the integrated circuit substrate using a plasma deposition process. In particular, the depositing step may include depositing a silicon nitride layer using a first plasma that receives an inert gas (e.g., argon gas), a nitrogen containing gas and a silicon containing gas (e.g., $SiH_4$) as source gases. In addition, the thickening step may include redepositing portions of the silicon nitride layer using a second plasma that receives the inert gas and the nitrogen containing gas, but not the silicon containing gas, as source gases. According to aspects of these embodiments, the plasma bias power used to establish the second plasma is greater than about two times a plasma bias power used to establish the first plasma. The thickening step may also be followed by a step of depositing additional silicon nitride onto the silicon nitride layer using a third plasma equivalent to the first plasma. Another thickening step may then be performed, which follows the step of depositing the additional silicon nitride.

Additional embodiments of the present invention include methods of forming field effect transistors by forming first and second insulated gate electrodes at side-by-side locations on an integrated circuit substrate and then forming a silicon nitride layer on the first and second insulated gate electrodes and in a gap between the first and second insulated gate electrodes. This step of forming the silicon nitride layer may include depositing the silicon nitride layer using a chemical vapor deposition process (e.g., PECVD) and/or a plasma deposition process. The silicon nitride layer is then selectively thickened. In particular, a portion of the silicon nitride layer located in the gap is then thickened by transferring portions of the silicon nitride layer extending opposite the first and second insulated gate electrodes into the gap using a sputtering process.

Still further embodiments of the present invention include depositing an electrically insulating layer on an integrated circuit substrate using a first deposition technique and then recessing a first portion of the deposited electrically insulating layer. This recessing step, which may be performed using a plasma redeposition technique having different process conditions relative to the first deposition technique, includes bombarding the first portion of the electrically insulating layer with a sufficient quantity of plasma ions to thereby physically remove electrically insulating material from the first portion of the electrically insulating layer and redeposit the removed electrically insulating material onto a second portion of the electrically insulating layer.

Additional methods of forming integrated circuit devices include depositing an electrically insulating layer having an undulating surface profile with at least one peak and at least on valley, using a first plasma established in a plasma deposition chamber. The composition of the first plasma is then adjusted by lowering a concentration of at least one source gas supplied thereto (e.g., $SiH_4$), to thereby cause recession of the at least one peak and redepositing of material removed from the at least one peak into the at least one valley. This adjusting step may also be followed by a step of readjusting the composition of the first plasma by increasing the concentration of the at least one source gas supplied thereto, to thereby cause deposition of additional electrically insulating material on the at least one peak.

DETAILED DESCRIPTION OF PREFERRED EMBODIMENTS

Figure 1A:
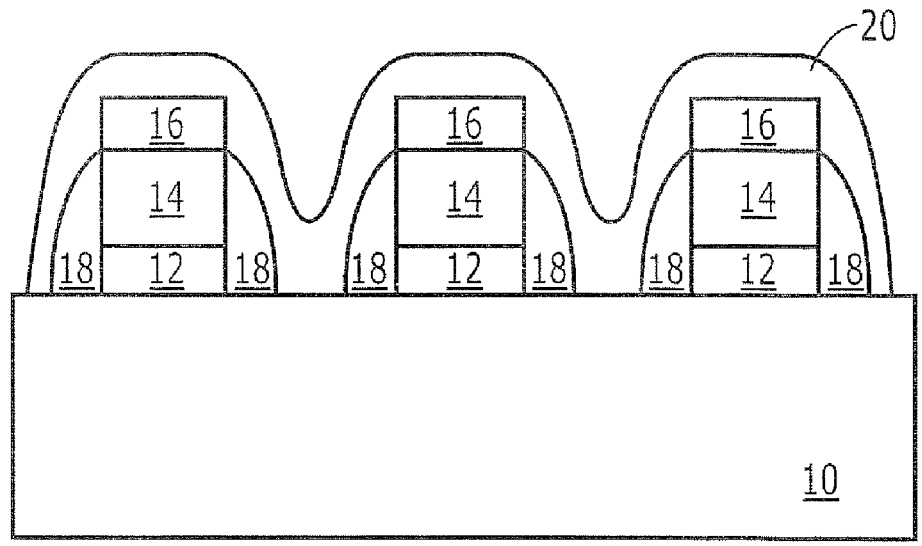
FIGS. 1A-1B are cross-sectional views of intermediate structures that illustrated methods of forming integrated circuit devices according to embodiments of the invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 1B:
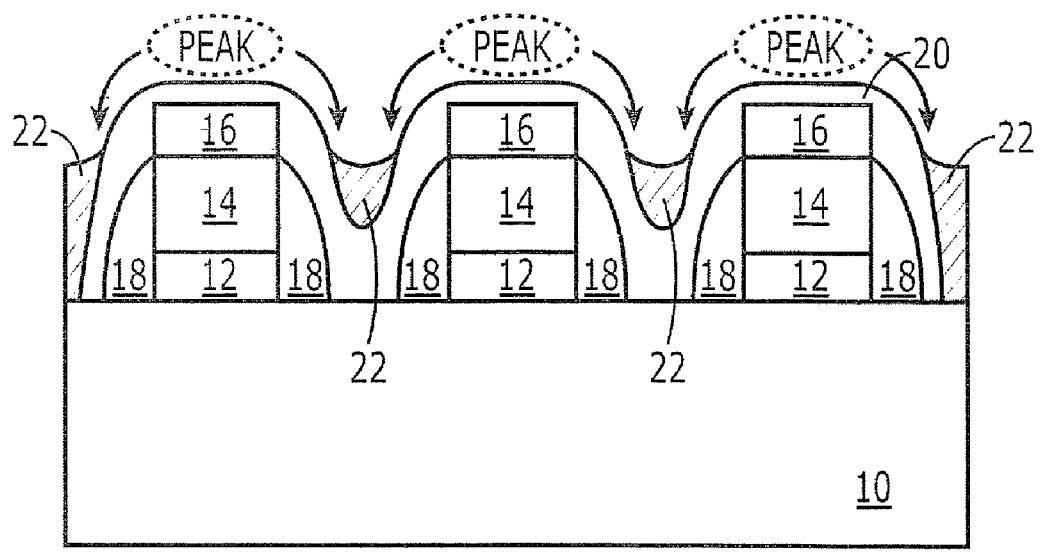

FIGS. 1A-1B illustrate methods of forming integrated circuit devices according to first embodiments of the present invention. As illustrated by FIG. 1A, a plurality of integrated circuit structures are formed at side-by-side locations on an integrated circuit substrate 10. These structures may include, but are not limited to, structures having relatively narrow aspect ratios (i.e., narrow width-to-height ratios), such as passive electronic devices, interconnects, insulated gate electrodes, etc. These insulated gate electrodes are illustrated as including a gate insulating region 12, an electrically conductive gate electrode 14 and a gate capping layer 16. Electrically insulating sidewall spacers 18 are also provided on sidewalls of the gate electrodes 14, as illustrated.

FIG. 1A also illustrates the formation of an electrically insulating layer 20 as a conformal layer that extends on the integrated circuit structures and in the gaps or spacing between the integrated circuit structures. As illustrated, the electrically insulating layer 20 may have an undulating surface profile with at least one peak (e.g., on top of each gate electrode) and at least one valley (e.g., in the spaces and gaps between the gate electrodes). According to some embodiments of the invention, the electrically insulating layer 20 may be a silicon nitride layer. This silicon nitride layer may be formed using a plasma deposition process (e.g., HDP (high density plasma) process). This plasma deposition process may include establishing a first plasma in a plasma processing chamber, using an inert gas (e.g., argon gas), a nitrogen containing gas (e.g., $N_2$ gas) and a silicon containing gas (e.g., $SiH_4$) as source gases. The first plasma may be established as a relatively low power (e.g., 400 W bias power), high frequency (HF) plasma and the volumetric flow rate of silane (i.e., $SiH_4$) as a source gas may be about 90 sccm. Alternatively, the silicon nitride layer may be formed in a deposition chamber using a chemical vapor deposition technique (e.g., PECVD).

Referring now to FIG. 1B, a step is then performed to selectively thicken portions of the electrically insulating layer 20 by redepositing portions of the electrically insulating layer 20. This redepositing includes transferring portions of the electrically insulating layer 20 from the peaks to the valleys, to thereby define redeposited insulating regions 22. This transfer of insulating material from the peaks to the valleys may occur in the plasma processing chamber, with the peaks of the electrically insulating layer 20 acting essentially as sputter targets for charged ions (e.g., nitrogen ions) generated within the plasma processing chamber. These charged ions impact and dislodge the insulating material from the peaks in the electrically insulating layer 20 and at least some of this dislodged material redeposit in the valleys of the electrically insulating layer 20 to thereby define redeposited insulating regions 22. The electrically insulating layer 20 and the redeposited insulating regions 22 may then be exposed to a sufficient dose of UV radiation to thereby improve a tensile strength of the insulating regions 22.

In particular, a second plasma may be established in the plasma processing chamber using an inert gas (e.g., argon gas) and a nitrogen containing gas (e.g., $N_2$ gas), but not an appreciable amount of a silicon containing gas, as source gases. The second plasma may be established as a relatively high power (e.g., 1200 W bias power), high frequency (HF) plasma and the volumetric flow rate of the silicon containing source gas may be set to a low level, including about 0 sccm. The high level of the plasma bias power associated with the second plasma should be at least two times greater than the plasma bias power associated with the first plasma.

Figure 2A:
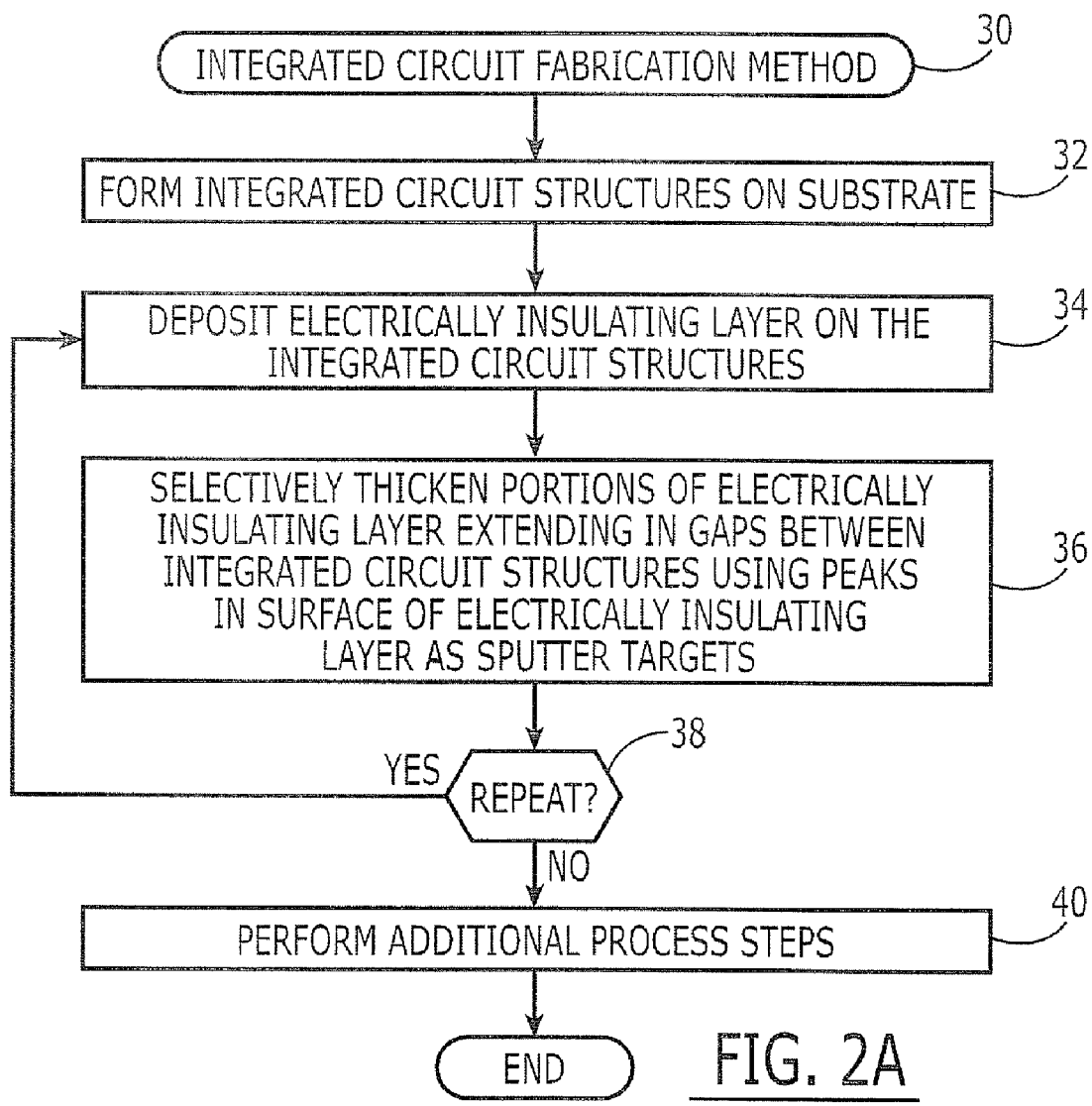
FIG. 2A is a flow diagram of process steps that illustrates methods of forming integrated circuit devices according to embodiments of the present invention.

FIG. 2A is a flow diagram of process steps that illustrates additional methods 30 of forming integrated circuit devices, according to embodiments of the present invention. As illustrated by Block 32, a plurality of integrated circuit structures (e.g., passive and/or active structures) are formed on a surface of an integrated circuit substrate. At least one electrically insulating layer is then deposited on the integrated circuit substrate. This deposition step may be performed using a chemical vapor deposition technique or a plasma deposition technique, for example. Other deposition techniques may also be used. This at least one electrically insulating layer extends on the integrated circuit structures and in the gaps (e.g., spaces) extending between adjacent ones of the integrated circuit structures, Block 34. Based on this deposition step, the resulting electrically insulating layer may have an undulating surface profile with at least one peak (e.g., on top of the integrated circuit structures) and at least one valley (e.g., in the spaces and gaps between the integrated circuit structures). In alternative embodiments of the invention, the electrically insulating layer may be formed using a dual-stress liner fabrication technique, which may accompany formation of CMOS integrated circuits having closely adjacent NMOS and PMOS transistors.

The electrically insulating layer is then selectively thickened, Block 36. In particular, portions of the electrically insulating layer extending in the gaps between the integrated circuit structures are thickened by transferring electrically insulating material from the peaks of the electrically insulating layer to the valleys of the electrically insulating layer. This material transfer step is performed by using the peaks of the electrically insulating layer as sputter targets for high energy ions (e.g., N+ ions) established in a high density plasma. The use of the peaks of the electrically insulating layer as sputter targets causes recession of the peaks in the electrically insulating layer and a redeposition of electrically insulating material into the valleys. As illustrated by the decision Block 38, the steps illustrated by Blocks 34 and 36 may be repeated to define a sufficiently thick electrically insulating layer. Additional process steps may then be performed to complete an integrated circuit fabrication process at the semiconductor wafer level, Block 40.

Figure 2B:
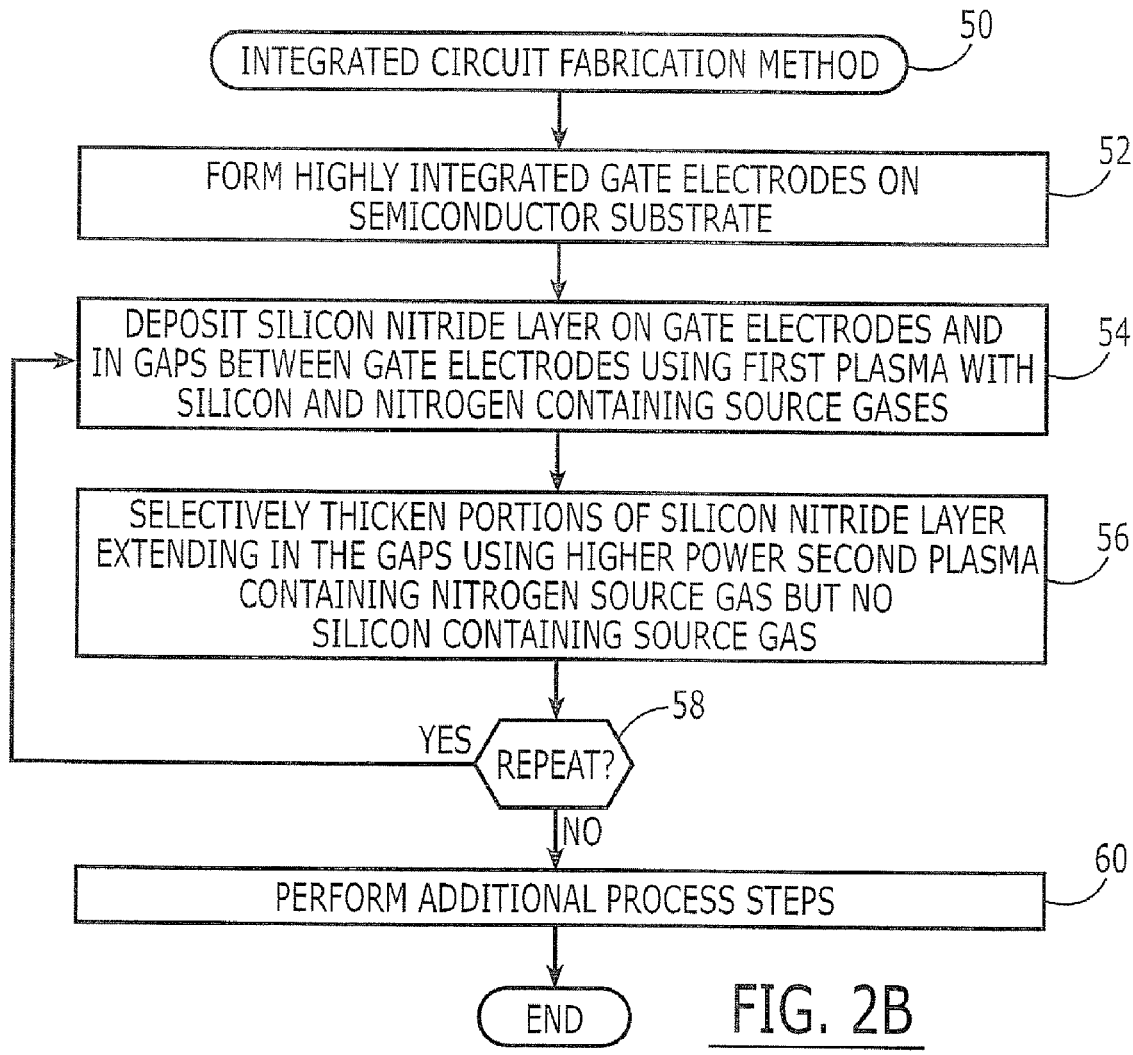
FIG. 2B is a flow diagram of process steps that illustrates methods of forming integrated circuit devices according to additional embodiments of the present invention.

FIG. 2B is a flow diagram of process steps that illustrates methods 50 of forming integrated circuit devices, according to embodiments of the present invention. As illustrated by Block 52, a highly integrated array of insulated gate electrodes are formed on a surface of an integrated circuit substrate. At least one silicon nitride layer is then deposited on the integrated circuit substrate, Block 34. This deposition step may be performed using a chemical vapor deposition technique or a plasma deposition technique, for example. Other deposition techniques may also be used. The silicon nitride layer is deposited to extend on the insulated gate electrodes and in the gaps (e.g., spaces) extending between adjacent ones of the insulated gate electrodes. Based on this conformal deposition step, the resulting silicon nitride layer may have an undulating surface profile with at least one peak (e.g., on top of the insulated gate electrodes) and at least one valley (e.g., in the spaces and gaps between the insulated gate electrodes).

The silicon nitride layer is then selectively thickened, Block 56. In particular, portions of the silicon nitride layer extending in the gaps between the insulated gate electrodes are thickened by transferring silicon nitride material from the peaks of the silicon nitride layer to the valleys of the silicon nitride layer. This material transfer step is performed by using the peaks of the silicon nitride layer as sputter targets for high energy ions (e.g., N+ ions) established in a high density plasma. The use of the peaks of the silicon nitride layer as sputter targets causes recession of the peaks in the silicon nitride layer and a redeposition of silicon nitride material into the valleys. As illustrated by the decision Block 58, the steps illustrated by Blocks 54 and 56 may be repeated to define a sufficiently thick silicon nitride layer. Additional process steps may then be performed to complete an integrated circuit fabrication process at the semiconductor wafer level, Block 60.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising the steps of:
    depositing an electrically insulating layer onto an integrated circuit substrate, said electrically insulating layer having an undulating surface profile with at least one peak and at least one valley; and
    thickening a portion of the electrically insulating layer by redepositing portions of the electrically insulating layer from the least one peak to the at least one valley using a sputter deposition technique that utilizes the electrically insulating layer as a sputter target.

2. The method of claim 1, wherein said depositing step comprises depositing the electrically insulating layer onto the integrated circuit substrate using a plasma deposition process.

3. The method of claim 1, wherein said depositing step comprises depositing a silicon nitride layer using a first plasma that receives an inert gas, a nitrogen containing gas and a silicon containing gas as source gases.

4. The method of claim 3, wherein the inert gas is an argon gas and the silicon containing gas is SiH4.

5. The method of claim 3, wherein said thickening step comprises redepositing portions of the silicon nitride layer using a second plasma that receives the inert gas and the nitrogen containing gas as source gases.

6. The method of claim 5, wherein a plasma bias power used to establish the second plasma is greater than about two times a plasma bias power used to establish the first plasma.

7. The method of claim 5, wherein said thickening step is followed by a step of depositing additional silicon nitride onto the silicon nitride layer using a third plasma equivalent to the first plasma.

8. The method of claim 1, wherein said depositing step is preceded forming first and second insulated gate electrodes at side-by-side locations on the integrated circuit substrate; and wherein said depositing step comprises depositing the electrically insulating layer as a silicon nitride layer on the first and second insulated gate electrodes and in a gap between the first and second insulated gate electrodes.

9. The method of claim 8, wherein said depositing step comprises using a chemical vapor deposition process and/or a plasma deposition process to deposit the silicon nitride layer.

10. A method of forming an integrated circuit device, comprising the steps of:
    forming first and second integrated circuit structures on an integrated circuit substrate;
    depositing an electrically insulating layer onto the first and second integrated circuit structures and into a gap extending between the first and second integrated circuit structures; and
    thickening a portion of the electrically insulating layer located in the gap by transferring portions of the electrically insulating layer extending opposite the first and second integrated circuit structures into the gap using a sputtering process.

11. The method of claim 10, wherein said depositing step comprises depositing the electrically insulating layer using a first plasma established at a first power level; and wherein said thickening step comprises transferring portions of the electrically insulating layer extending opposite the first and second integrated circuit structures into the gap using a sputtering process that includes establishing a second plasma at a second power level at least two times greater than the first power level.

12. The method of claim 11, wherein the first plasma receives an inert gas, a nitrogen containing gas and a silicon containing gas as source gases; and wherein the second plasma receives an inert gas and a nitrogen containing gas, but no silicon containing gas, as source gases.

13. The method of claim 10, wherein said depositing step comprises depositing the electrically insulating layer using a plasma-enhanced chemical vapor deposition process.

14. The method of claim 13, wherein the plasma-enhanced chemical vapor deposition process and the sputtering process are performed in different processing chambers.

15. A method of forming an integrated circuit device, comprising the steps of:
    forming a silicon nitride layer having an undulating surface profile, on an integrated circuit substrate; and
    sputter depositing silicon nitride into at least one valley in the undulating surface profile, using at least one peak in the undulating surface profile as a sputter target.

16. The method of claim 15, wherein said sputter depositing step comprises exposing the at least one peak in the undulating surface profile to a second plasma containing nitrogen ions.

17. The method of claim 16, wherein said forming step comprises exposing the integrated circuit substrate to a first plasma containing nitrogen and silicon ions.

18. The method of claim 17, wherein an RF bias power used to establish the second plasma is greater than about two times an RF bias power to establish the first plasma.

19. The method of claim 18, wherein the first and second plasmas are established in the same plasma processing chamber.

20. A method of forming an integrated circuit device, comprising the steps of:
    depositing an electrically insulating layer on an integrated circuit substrate using a first deposition technique; and
    recessing a first portion of the electrically insulating layer using a plasma redeposition technique having different process conditions relative to the first deposition technique, by bombarding the first portion of the electrically insulating layer with a sufficient quantity of plasma ions to thereby physically remove electrically insulating material from the first portion of the electrically insulating layer and redeposit the removed electrically insulating material on a second portion of the electrically insulating layer.

21. The method of claim 1, wherein said recessing step is followed by a step of exposing the electrically insulating layer to UV radiation.

22. The method of claim 1, wherein said depositing step comprises depositing the electrically insulating layer using a first plasma established in a plasma deposition chamber; and wherein said thickening step comprises adjusting a composition of the first plasma by lowering a concentration of at least one source gas supplied thereto, to thereby cause recession of the at least one peak and redepositing of material removed from the at least one peak into the at least one valley.

23. The method of claim 22, wherein said adjusting step is followed by a step of readjusting the composition of the first plasma by increasing the concentration of the at least one source gas supplied thereto, to thereby cause deposition of additional electrically insulating material on the at least one peak.

* * * * *